United States Patent
Nien et al.

(10) Patent No.: US 8,030,911 B2
(45) Date of Patent: Oct. 4, 2011

(54) HYBRID CONTROL CIRCUIT AND METHOD

(75) Inventors: Hung-Shou Nien, Changhua (TW);
Kuang-Yao Cheng, Zhudong Township, Hsinchu County (TW); Yi-Chiang Fu, Zhubei (TW); Wei-Hsu Chang, Jubei (TW)

(73) Assignee: Richtek Technology Corp., Hsinchu (TW)

( * ) Notice: Subject to any disclaimer, the term of this patent is extended or adjusted under 35 U.S.C. 154(b) by 35 days.

(21) Appl. No.: 12/721,853

(22) Filed: Mar. 11, 2010

(65) Prior Publication Data
US 2010/0238060 A1 Sep. 23, 2010

(30) Foreign Application Priority Data

Mar. 19, 2009 (TW) .............................. 98108864 A

(51) Int. Cl.
*G05F 1/00* (2006.01)

(52) U.S. Cl. ........................................ 323/283; 323/272
(58) Field of Classification Search .................. 323/272, 323/283
See application file for complete search history.

(56) References Cited

U.S. PATENT DOCUMENTS 6,806,689 B2 * 10/2004 Schuellein et al. ........... 323/272
* cited by examiner

*Primary Examiner* — Shawn Riley
(74) *Attorney, Agent, or Firm* — Rosenberg, Klein & Lee

(57) ABSTRACT

A hybrid control circuit and method combine analog circuit and digital circuit to generate digital PWM signals for a multiphase DC-DC converter to generate an output voltage. For current balance control, analog current error signals are generated by the analog circuit from analog phase current signals of the multiphase DC-DC converter and then converted into digital current error signals for calculating the duties of each phase of the multiphase DC-DC converter. Therefore, fewer bit devices can be used to achieve precise current balance control and the size and cost of the circuit can be reduced.

21 Claims, 6 Drawing Sheets

HYBRID CONTROL CIRCUIT AND METHOD

FIELD OF THE INVENTION

The present invention is related generally to a multiphase DC-DC converter and, more particularly, to a control circuit and method for a multiphase DC-DC converter.

BACKGROUND OF THE INVENTION

Nowadays, as electronic components require increasingly higher current for operation, multiphase DC-DC buck converters have become popular solutions because they can provide higher power, have better efficiency, and are easier for modularization. Taking a four-phase DC-DC buck converter shown in FIG. 1 for example, a control circuit 10 provides four pulse width modulation (PWM) signals PWMa, PWMb, PWMc, PWMd for output stages 12a, 12b, 12c, 12d of the four phases, respectively, to signal the drivers in the four output stages 12a, 12b, 12c, 12d to switch their respective power MOSFETs, so as to supply phase currents Ia, Ib, Ic, Id to a bus 14, respectively, where to be combined into an output current to charge a capacitor C and thereby generate an output voltage Vo. The output voltage Vo and the phase currents Ia, Ib, Ic, Id are fed back to the control circuit 10 for determining the duties of the PWM signals PWMa, PWMb, PWMc, PWMd. As the multiphase DC-DC buck converter includes several phases, the phase currents Ia, Ib, Ic, Id may be unbalanced due to mismatch between components of different phases. The mismatch between the components can be attributed to such factors as the inductance of each phase, the equivalent resistance of inductors, the on-resistance of the power MOSFETs, the parasitic resistance of traces on the printed circuit board, and so on. The unbalanced currents cause uneven power and heat distribution in the converter so that the system's efficiency and reliability are reduced. To solve the problems associated with current imbalance, the control circuit 10 is additionally provided with a current balance mechanism for adjusting the duties of the PWM signals PWMa, PWMb, PWMc, PWMd according to intensities of the phase currents Ia, Ib, Ic, Id so as to balance the phase currents Ia, Ib, Ic, Id. U.S. Pat. No. RE 38,454 proposes an analog solution to achieve current balance between different phases of a multiphase DC-DC buck converter. Such analog solutions typically require an external ramp signal and a comparator for generating PWM signals.

On the other hand, as digital electric technology has higher programmability, is more flexible, and allows better diagnosis than its analog counterpart, digital multiphase DC-DC buck converters have been viewed as the next-generation electricity solution. However, digital current balance methods are also needed, as are analog current balance methods for the analog solutions, to make the converters more efficient and more reliable. U.S. Pat. No. 6,795,009 discloses a method for implementing digital current balance in a digital multiphase DC-DC buck converter, in which a full-range analog-to-digital converter (ADC) is required for converting currents of different phases into digital signals, before digital operation is carried out. This method faces the following dilemma: if it is desired to achieve more precise balance control, then a wider (higher bit-rate) ADC is necessary, which nevertheless increases the size and cost of the circuit; and if a lower bit-rate ADC is employed to reduce the size and cost of the circuit, the balance control can only be achieved with less precision. Now that the various phase currents generated by a multiphase DC-DC buck converter are all analog currents, a digital current-balance circuit and method applicable to such converter will inevitably encounter the aforementioned problems caused by analog-to-digital conversion.

Therefore, it is desired a digital current-balance solution that can be implemented by a small and low-cost circuit.

SUMMARY OF THE INVENTION

It is an object of the present invention to provide a low-cost, high-precision digital current-balance circuit and method for a multiphase DC-DC converter.

According to the present invention, a circuit and method for achieving digital current balance in a multiphase DC-DC converter are implemented simply by sampling differences between phase currents and an average current thereof and then converting the differences into digital signals so that it is possible to relax the specifications of analog-to-digital converters for use in the circuit and method.

In an embodiment, a hybrid control circuit is configured for providing a plurality of digital PWM signals for a multiphase DC-DC converter to generate an output voltage. The hybrid control circuit includes a current balance controller for generating digital current error signals, and a voltage controller for generating a digital voltage error signal. A combiner combines the digital current error signals with the digital voltage error signal to generate duty control signals. A digital pulse-width modulator then calculates the duty of each phase according to the duty control signals. More particularly, the current balance controller includes an analog average-current generator for generating an analog average-current signal from all the analog phase-current signals, a first analog error generator for comparing the analog phase-current signal of each phase with the analog average-current signal to generate the analog current error signal of each phase, and a first analog-to-digital converter for converting the analog current error signals into the digital current error signals. On the other hand, the voltage controller monitors the output voltage to generate the digital voltage error signal accordingly.

In an embodiment, a hybrid control method is used to provide a plurality of digital PWM signals for a multiphase DC-DC converter to generate an output voltage. The control method includes generating an analog average-current signal from all the analog phase-current signals, comparing the analog phase-current signal of each phase with the analog average-current signal so as to generate the analog current error signal of each phase, converting the analog current error signals into digital current error signals, monitoring the output voltage to generate a digital voltage error signal accordingly, combining the digital current error signals with the digital voltage error signal to generate duty control signals, and calculating the duty of each phase according to the duty control signals.

Since the analog current error signals are generated, sampled, and then converted into the digital current error signals, in that order, a lower bit-rate analog-to-digital converter can be used to generate more precise digital current error signals. Therefore, not only are the size and cost of the circuit reduced, but also the precision of current balance control is enhanced.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
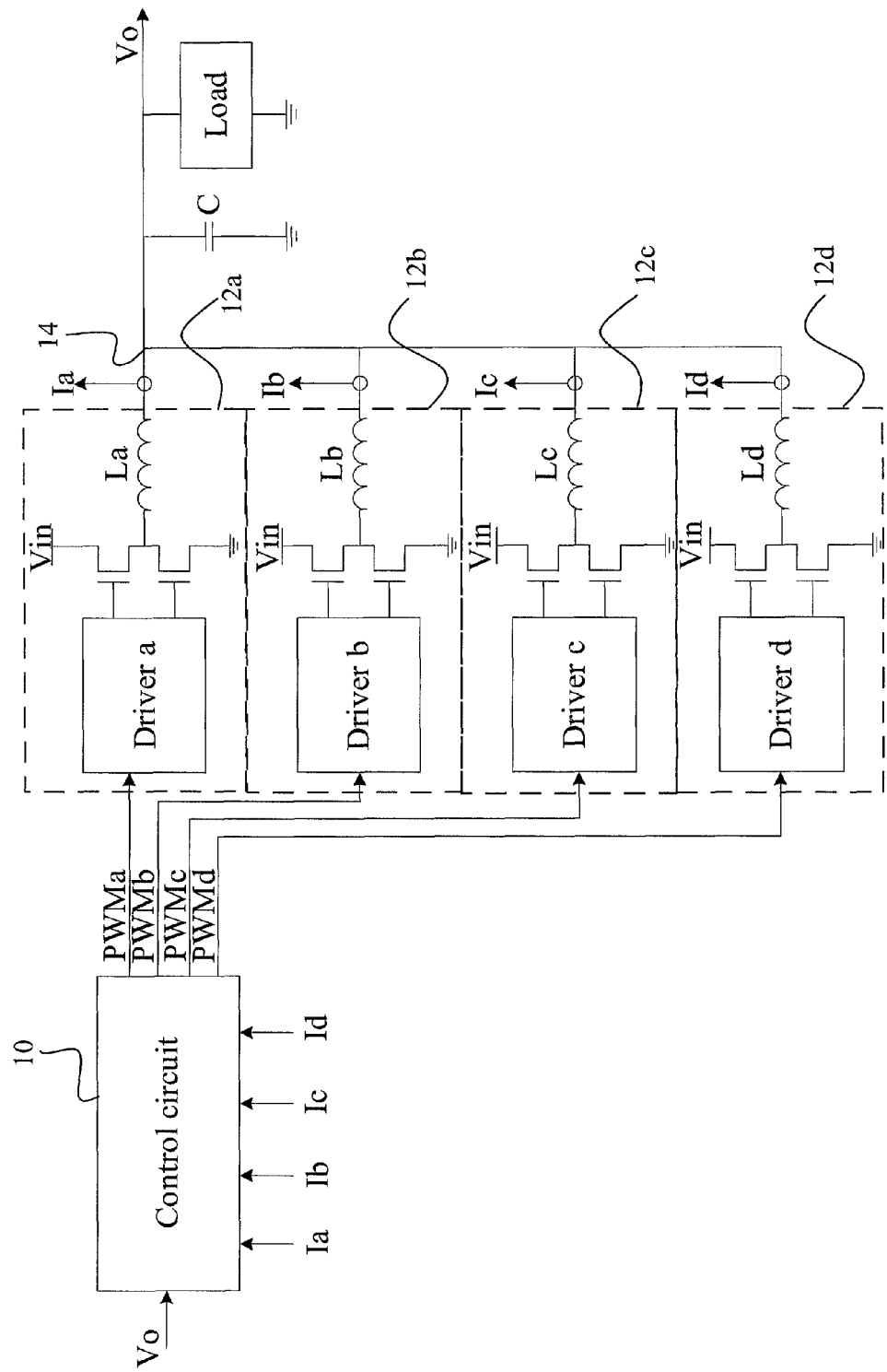
FIG. 1 is a block diagram of a four-phase DC-DC buck converter.
Figure 2:
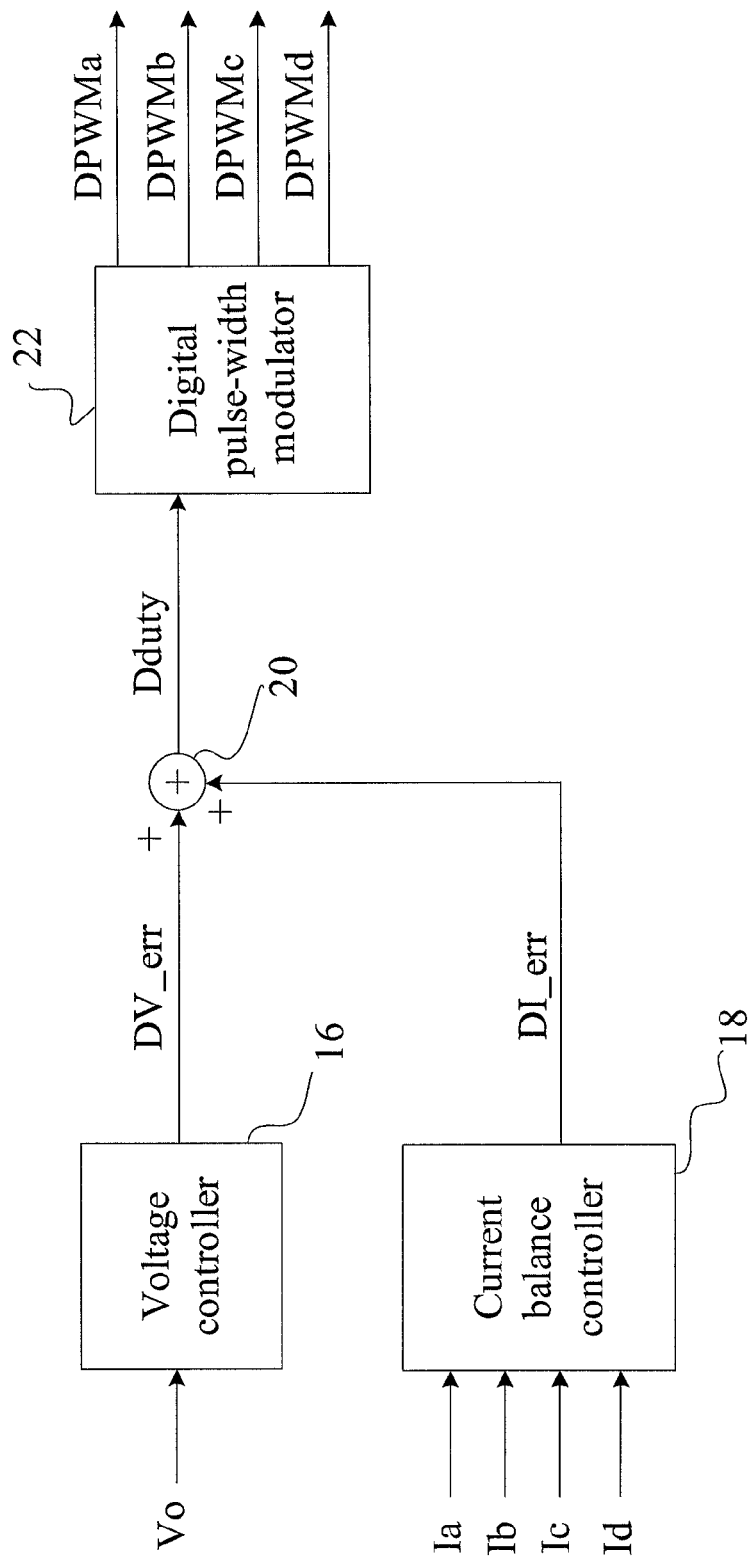
FIG. 2 is a block diagram of a hybrid control circuit according to the present invention.

FIG. 2 is a block diagram of a hybrid control circuit according to the present invention, in which a voltage controller 16 monitors the output voltage Vo of a multiphase DC-DC converter to generate a digital voltage error signal DV_err accordingly, a current balance controller 18 generates a digital current error signal DI_err for each phase of the multiphase DC-DC converter according to the analog phase-current signal Ia, Ib, Ic, Id of each phase, a combiner 20 combines the digital voltage error signal DV_err with the digital current error signals DI_err to generate a duty control signal Dduty for each phase, and a digital pulse-width modulator 22 calculates the duty of each phase according to the duty control signals Dduty so as to generate digital PWM signals DPWMa, DPWMb, DPWMc, DPWMd corresponding the respective four phases. The digital PWM signals DPWMa, DPWMb, DPWMc, DPWMd are to be provided for corresponding output stages (not shown), respectively. In this hybrid control circuit, both the combiner 20 and the digital pulse-width modulator 22 are digital circuits, the current balance controller 18 is an analog circuit, and the voltage controller 16 can be an analog or digital circuit.

Figure 3:
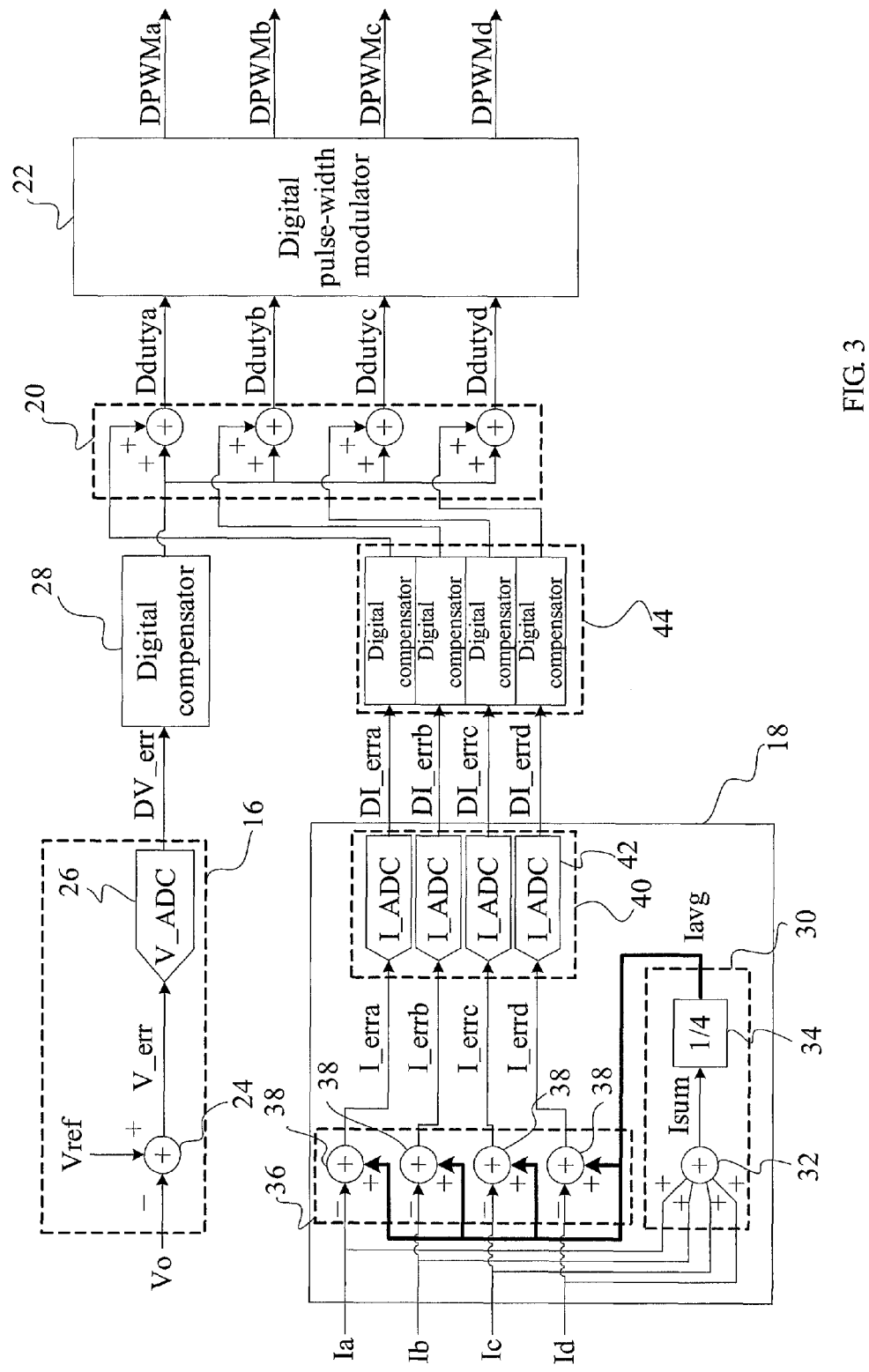
FIG. 3 is a circuit diagram of an embodiment implementing the block diagram of FIG. 2.

FIG. 3 is a circuit diagram of an embodiment implementing the block diagram of FIG. 2. In the current balance controller 18, an analog average-current generator 30 includes an analog adder 32 to receive and combine the analog phase-current signals Ia, Ib, Ic, Id to generate an analog summed-current signal Isum, and an analog divider 34 connected to the analog adder 32 to divide the analog summed-current signal Isum by four, which is the phase number in this embodiment, so as to generate an analog average-current signal Iavg, a first analog error generator 36 is connected to the analog average-current generator 30 and includes four analog subtractors 38, each configured for subtracting the analog phase-current signal Ia, Ib, Ic, Id of a corresponding phase from the analog average-current signal Iavg so as to generate the analog current error signal I_erra, I_errb, I_errc, I_errd of each phase, and a first analog-to-digital converter 40 is connected to the first analog error generator 36 and includes four analog-to-digital converting units 42 for converting the analog current error signals I_erra, I_errb, I_errc, I_errd into digital current error signals DI_erra, DI_errb, DI_errc, DI_errd, respectively. Since the current balance controller 18 does not directly convert the analog phase-current signal Ia, Ib, Ic, Id of each phase into a digital signal, but converts the difference I_erra, I_errb, I_errc, I_errd between the analog phase-current signal Ia, Ib, Ic, Id of each phase and the analog average-current signal Iavg into a digital signal, more precise converted values can be obtained using fewer bits. Therefore, the first analog-to-digital converter 40 only requires a low bit-rate circuit and thus eliminates the need for a large data bus and a bulky digital processing circuit. In addition, as the error of digitization is reduced, current balance control based on the digitization results is carried out with enhanced precision, allowing the currents of the various phases to be truly equal to one another. On the other hand, the voltage controller 16 includes a second analog error generator 24 to generate an analog voltage error signal V_err according to the output voltage Vo and an analog reference voltage Vref, a second analog-to-digital converter 26 to convert the analog voltage error signal V_err into the digital voltage error signal DV_err. The analog reference voltage Vref represents a target value of the output voltage Vo and is provided from within or without the voltage controller 16. For the same reason stated above, the second analog-to-digital converter 26 only needs to be a low bit-rate circuit to obtain high precise converted values. This embodiment further includes digital compensators 28 connected between the voltage controller 16 and the combiner 20 to compensate the digital voltage error signal DV_err, and a digital compensator 44 connected between the current balance controller 18 and the combiner 20 to compensate the digital current error signals DI_erra, DI_errb, DI_errc, DI_errd. The digital compensators 28 and 44 ensure that, while the DC-DC converter operates in a steady state, output voltage control as well as the adjustment of each phase current is effectively accelerated. The combiner 20 combines the compensated digital voltage error signal DV_err with each of the compensated digital current error signals DI_erra, DI_errb, DI_errc, DI_errd so as to generate a duty control signal Ddutya, Ddutyb, Ddutyc, Ddutyd for each phase, for the digital pulse-width modulator 22 to calculate the duty of each phase accordingly so as to generate the digital PWM signal DPWMa, DPWMb, DPWMc, DPWMd of each phase.

Figure 4:
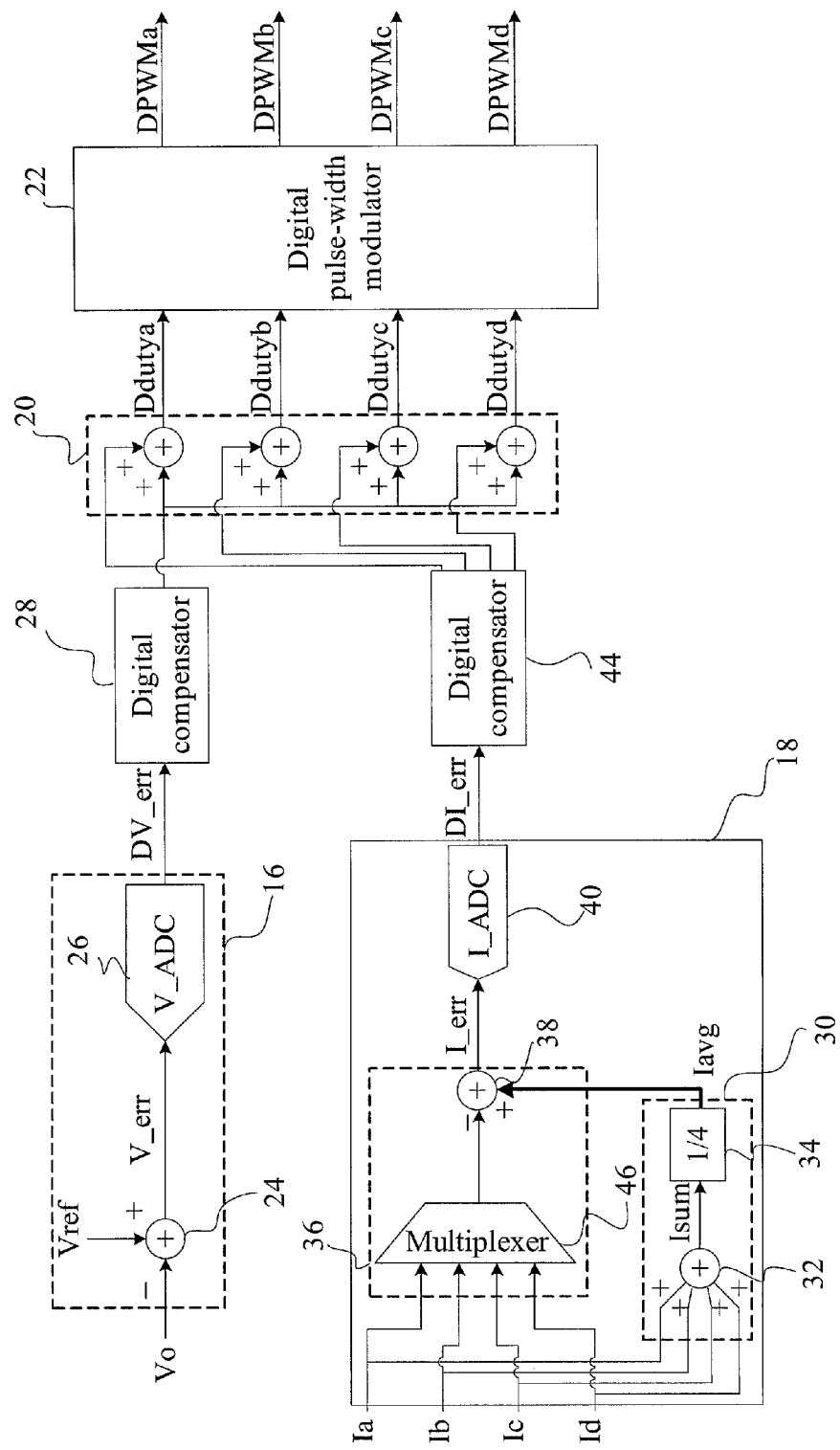
FIG. 4 is a circuit diagram of a second embodiment for the current balance controller according to the present invention.

FIG. 4 is a circuit diagram of a second embodiment for the current balance controller 18, in which the first analog error generator 36 uses a multiplexer 46 to sample the analog phase-current signals Ia, Ib, Ic, Id, before a single analog subtractor 38 subtracts each of the sampled analog phase-current signals from the analog average-current signal Iavg so as to generate analog current error signals I_err, and then the first analog-to-digital converter 40 converts the analog current signals I_err into the digital current error signals DI_err. In this embodiment, the first analog error generator 36 needs only one analog subtractor 38, the first analog-to-digital converter 40 needs only one analog-to-digital converting unit, the current balance controller 18 needs only one output port DI_err, and the digital compensator 44 needs only one compensating unit. In consequence, the size and cost of the circuit are further reduced.

Figure 5:
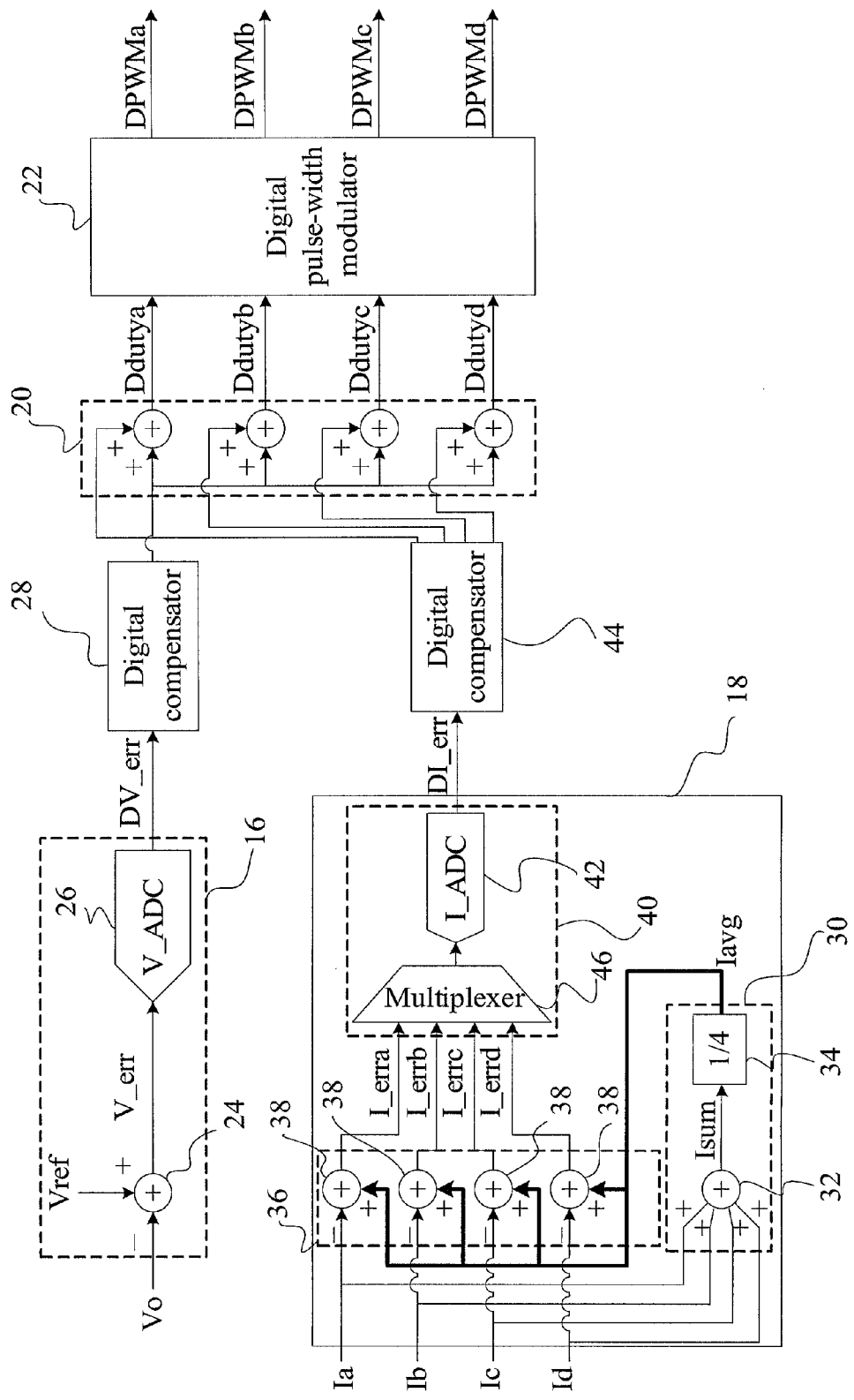
FIG. 5 is a circuit diagram of a third embodiment for the current balance controller according to the present invention.

FIG. 5 is a circuit diagram of a third embodiment for the current balance controller 18, in which the first analog-to-digital converter 40 includes a multiplexer 46 to sample the analog current error signals I_erra, I_errb, I_errc, I_errd, and an analog-to-digital converting unit 42 to convert the sampled analog current error signals into the digital current error signals DI_err. In this embodiment, the first analog-to-digital converter 40 needs only one analog-to-digital converting unit 42 so that the size and cost of the current balance controller 18 are reduced. Also, the current balance controller 18 in this embodiment needs only one output port DI_err.

Figure 6:
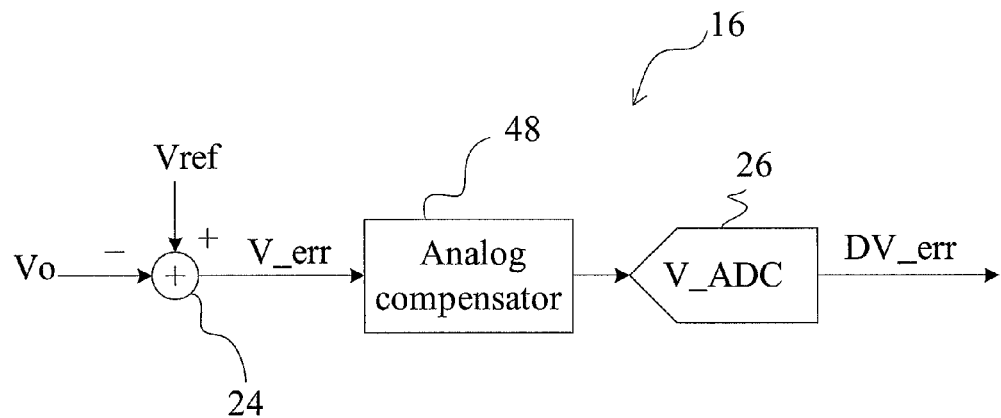
FIG. 6 is a circuit diagram of a second embodiment for the voltage controller according to the present invention.

Compensation of the current error signals may alternatively be carried out in the current balance controller 18. For example, an analog compensator can be added upstream of the first analog analog-to-digital converter 40 so as to compensate the analog current error signals I_err or I_erra, I_errb, I_errc, I_errd. Besides, compensation of the voltage error signal may also be conducted inside the voltage controller 16. Referring to FIG. 6, which shows a second embodiment for the voltage controller 16, an analog compensator 48 is connected between the second analog error generator 24 and the second analog-to-digital converter 26 and serves to compensate the analog voltage error signal V_err prior to analog-to-digital conversion.

Figure 7:
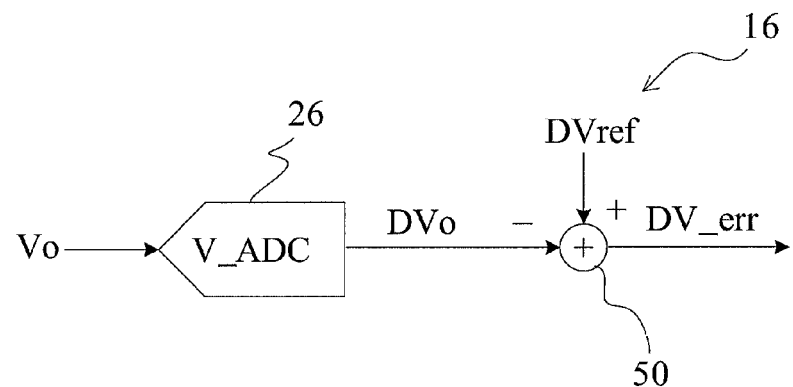
FIG. 7 is a circuit diagram of a third embodiment for the voltage controller according to the present invention.

Refer to FIG. 7 for a third embodiment of the voltage controller 16 that is different from the previous embodiments in the following manner. Firstly, the output voltage Vo is converted by the second analog-to-digital converter 26 into a digital output voltage DVo, and then a digital error generator 50 compares the digital output voltage DVo with a digital reference voltage DVref to generate the digital voltage error signal DV_err. The digital reference voltage DVref is either pre-stored in the voltage controller 16 or provided from outside the voltage controller 16. In addition, the digital reference voltage DVref can be adjustable or programmable. Alternatively, the digital reference voltage DVref is converted from an analog reference voltage by the analog-to-digital converter in the voltage controller 16. In contrast to the foregoing embodiments, the voltage controller 16 in the third embodiment converts the output voltage Vo into a digital signal and then generates the digital voltage error signal DV_err accordingly. As a result, it is necessary for the second analog-to-digital converter 26 in the third embodiment to use a high bit-rate circuit.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A hybrid control circuit for providing a plurality of digital PWM signals to control a multiphase DC-DC converter to generate an output voltage, the hybrid control circuit comprising:
   a current balance controller including:
      an analog average-current generator for averaging analog phase-current signals of all phases of the multiphase DC-DC converter to generate an analog average-current signal;
      a first analog error generator connected to the analog average-current generator for comparing each of the analog phase-current signals with the analog average-current signal to generate an analog current error signal for each of the phases; and
      a first analog-to-digital converter connected to the first analog error generator for converting each of the analog current error signals into a digital current error signal;
   a voltage controller for monitoring the output voltage to generate a digital voltage error signal;
   a combiner connected to the current balance controller and the voltage controller for combining each of the digital current error signals with the digital voltage error signal to generate duty control signals for each of the phases; and
   a digital pulse-width modulator connected to the combiner for calculating duties for each of the phases according to the duty control signals, so as to generate the plurality of digital PWM signals.

2. The hybrid control circuit of claim 1, wherein the analog average-current generator comprises:
   an analog adder for combining the analog phase-current signals to generate an analog summed-current signal; and
   an analog divider connected to the analog adder for dividing the analog summed-current signal by a phase number of the multiphase DC-DC converter to generate the analog average-current signal.

3. The hybrid control circuit of claim 1, wherein the first analog error generator comprises a plurality of analog subtractors connected to the analog average-current generator, each of which subtracts one of the analog phase-current signals from the analog average-current signal to generate the analog current error signal of its respective phase.

4. The hybrid control circuit of claim 1, wherein the first analog error generator comprises:
   a multiplexer for sampling the analog phase-current signals; and
   an analog subtractor connected to the multiplexer and the analog average-current generator for generating the analog current error signals.

5. The hybrid control circuit of claim 1, wherein the first analog-to-digital converter comprises a plurality of analog-to-digital converting units connected to the first analog error generator for converting the analog current error signals into the digital current error signals.

6. The hybrid control circuit of claim 1, wherein the first analog-to-digital converter comprises:
   a multiplexer connected to the first analog error generator for sampling the analog current error signals; and
   an analog-to-digital converting unit connected to the multiplexer for converting the analog current error signals into the digital current error signals.

7. The hybrid control circuit of claim 1, further comprising a digital compensator connected between the current balance controller and the combiner for compensating the digital current error signals.

8. The hybrid control circuit of claim 1, wherein the current balance controller further comprises an analog compensator connected between the first analog error generator and the first analog-to-digital converter for compensating the analog current error signals.

9. The hybrid control circuit of claim 1, wherein the voltage controller comprises:
   a second analog error generator for generating an analog voltage error signal according to the output voltage and an analog reference voltage; and
   a second analog-to-digital converter for converting the analog voltage error signal into the digital voltage error signal.

10. The hybrid control circuit of claim 9, wherein the voltage controller further comprises an analog compensator connected between the second analog error generator and the second analog-to-digital converter for compensating the analog voltage error signal.

11. The hybrid control circuit of claim 1, wherein the voltage controller comprises:
   a second analog-to-digital converter for converting the output voltage into a digital output voltage; and
   digital error generator connected to the second analog-to-digital converter for generating the digital voltage error signal according to the digital output voltage and a digital reference voltage.

12. The hybrid control circuit of claim 1, further comprising a digital compensator connected between the voltage controller and the combiner for compensating the digital voltage error signal.

13. A hybrid control method for providing a plurality of digital PWM signals to control a multiphase DC-DC converter to generate an output voltage, the hybrid control method comprising:
- (A) averaging analog phase-current signals of all phases of the multiphase DC-DC converter for generating an analog average-current signal;
- (B) comparing each of the analog phase-current signals with the analog average-current signal for generating an analog current error signal for each of the phases;
- (C) converting each of the analog current error signals into a digital current error signal;
- (D) monitoring the output voltage for generating a digital voltage error signal;
- (E) combining each of the digital current error signals with the digital voltage error signal for generating duty control signals for each of the phases; and
- (F) calculating duties for each of the phases according to the duty control signals for generating the plurality of digital PWM signals.

14. The hybrid control method of claim 13, wherein the step A comprises:
- combining the analog phase-current signals for generating an analog summed-current signal; and
- dividing the analog summed-current signal by a phase number of the multiphase DC-DC converter for generating the analog average-current signal.

15. The hybrid control method of claim 13, wherein the step B comprises:
- sampling the analog phase-current signals; and
- subtracting each of the sampled analog phase-current signals from the analog average-current signal for generating the analog current error signals.

16. The hybrid control method of claim 13, wherein the step C comprises:
- sampling the analog current error signals; and
- converting the sampled analog current error signals into the digital current error signals.

17. The hybrid control method of claim 13, further comprising compensating the analog current error signals.

18. The hybrid control method of claim 13, wherein the step D comprises:
- generating an analog voltage error signal according to the output voltage and an analog reference voltage; and
- converting the analog voltage error signal into the digital voltage error signal.

19. The hybrid control method of claim 18, further comprising compensating the analog voltage error signal.

20. The hybrid control method of claim 13, wherein the step D comprises:
- converting the output voltage into a digital output voltage; and
- generating the digital voltage error signal according to the digital output voltage and a digital reference voltage.

21. The hybrid control method of claim 13, further comprising compensating the digital voltage error signal.

* * * * *